(12) United States Patent
Esumi et al.

(10) Patent No.: US 8,472,563 B2
(45) Date of Patent: *Jun. 25, 2013

(54) SIGNAL PROCESSING APPARATUS, SIGNAL PROCESSING METHOD AND STORAGE SYSTEM

(75) Inventors: Atsushi Esumi, Kyoto (JP); Kai Li, Kyoto (JP); Hidemichi Mizuno, Musashimurayama (JP)

(73) Assignee: Rohm Co., Ltd. (JP)

( * ) Notice: Subject to any disclaimer, the term of this patent is extended or adjusted under 35 U.S.C. 154(b) by 2040 days.

This patent is subject to a terminal disclaimer.

(21) Appl. No.: 11/524,566

(22) Filed: Sep. 21, 2006

(65) Prior Publication Data

US 2007/0104301 A1 May 10, 2007

(30) Foreign Application Priority Data

Sep. 22, 2005 (JP) ................................. 2005-276950

(51) Int. Cl.
*H04L 25/06* (2006.01)

(52) U.S. Cl.
USPC ........... 375/317; 375/233; 375/236; 375/219; 375/238; 375/346

(58) Field of Classification Search
USPC ........................................................ 375/346
See application file for complete search history.

(56) References Cited

U.S. PATENT DOCUMENTS

| | | | |
|---|---|---|---|
| 7,864,890 B2 * | 1/2011 | Esumi et al. .................. | 375/317 |
| 2007/0104300 A1 * | 5/2007 | Esumi et al. .................. | 375/346 |

FOREIGN PATENT DOCUMENTS

| | | |
|---|---|---|
| JP | 9-274702 A | 10/1997 |
| JP | 10-105908 A | 4/1998 |
| JP | 11-185209 | 7/1999 |
| JP | 11-266185 | 9/1999 |
| JP | 2000-48490 A | 2/2000 |
| JP | 2004-127409 | 4/2004 |
| JP | 2004-164767 A | 6/2004 |

OTHER PUBLICATIONS

Notification of Reason(s) for Refusal for Japanese Application No. 2005-276950 dispatched Feb. 1, 2011 with English translation.

* cited by examiner

*Primary Examiner* — Lihong Yu
(74) *Attorney, Agent, or Firm* — Cantor Colburn LLP

(57) ABSTRACT

A signal processing apparatus includes a first baseline wander correcting unit, provided in a processing path in which a predetermined processing is performed on an input signal, which corrects baseline wander by a feedforward and a second baseline wander correcting unit, provided anterior to the first baseline wander unit, which corrects the baseline wander by a feedback control. The first baseline wander correcting unit derives an amount of baseline wander. Further, it calculates a value corresponding to an average value of the amount of derived baseline wander and fine-adjusts a correction amount of baseline. Then it corrects the baseline wander by using the fine-adjusted baseline amount. The second baseline wander correcting unit calculates a value corresponding to an average value of the amount of baseline wander derived by the baseline wander derivation unit and coarse-adjusts a correction amount of baseline, and corrects the baseline wander by using the coarse-adjusted baseline amount. The fine correcting by the first baseline wander correcting unit and the coarse correcting by the second baseline correcting unit ensure efficient correction of baseline wander.

15 Claims, 12 Drawing Sheets

SIGNAL PROCESSING APPARATUS, SIGNAL PROCESSING METHOD AND STORAGE SYSTEM

BACKGROUND OF THE INVENTION

1. Field of the Invention

The present invention relates to an access technology for a storage medium and, more particularly, to a signal processing apparatus, a signal processing method, and a storage system.

2. Description of the Related Art

In the area of disk drives, attention has recently been focused on disk storage apparatuses of perpendicular magnetic recording system which are capable of increasing the recording density. With the conventional disk drives of longitudinal magnetic recording method, a magnetization corresponding to binary recorded data is formed in the longitudinal direction of the disk medium. In contrast to this, with the disk drives of perpendicular magnetic recording method, the same magnetization is formed in the depth direction of the disk medium.

Generally, with disk drives, data are recorded on the disk medium by a NRZ (non-return-to-zero) record encoding method. When the recorded data are read by the head from the surface of the disk medium, the reproduced signals (read signals) are a dipulse signal sequence for a longitudinal magnetic recording system. For a perpendicular magnetic recording system, on the other hand, the same reproduced signals are a pulse signal stream including a direct current (DC) low-frequency component.

Generally, the read channel system (reproduced signal processing system including a read amplifier) of a disk drive is such that the analog front-end circuit of a read amplifier, AC coupling, and the like has a low-frequency cutoff characteristic. This is intended in part to improve the SNR (signal-to-noise ratio) of reproduced signals by removing unnecessary low-frequency noise component from reproduced signals.

In a perpendicular magnetic recording system, the reproduced signals contain low-frequency components, and thus a phenomenon in which the baselines of reproduced signals are varied is observed when the low-frequency noise components are cut off by the analog front-end circuit having a low-frequency cutoff characteristic. If such variation in the baseline of reproduced signals occurs, a problem of higher decoding error rate will arise when the recorded data are decoded from the reproduced signals.

To resolve this problem, one possible solution may be to lower the low-frequency cutoff frequency of the read channel system. However, simply widening the passband will lead to an SNR deterioration of reproduced signals because it cannot cut off the low-frequency noise components. Moreover, the read amplifier, in particular, is normally sensitive to the low-frequency noise, such as 1/f noise, so that it is even more subject to the SNR deterioration. Hence, with a perpendicular magnetic recording system, simply lowering the low-frequency cutoff frequency of the read channel will rather result in raising the error rate.

As a conventional method for countering the baseline variation, there has been a proposed technique in which an ideal value of baseline and the difference of it from the actual value of baseline are determined and correction is made by feeding back the value of difference to a process before the input side of the A-D converter (See Reference (1) in the following Related Art List, for instance). Note here that "baseline variation" will be referred to as "baseline wander" also in this patent specification and these two terms are used interchangeably. Also, another proposed technique achieves a baseline without variation by first obtaining reverse characteristics of varying components of the baseline and then finding the differences from the varying baseline (See Reference (2), for instance). Also, there is a proposed method for correcting the baseline variation by the use of the total value of detected direct current components of analog signals (See Reference (3), for instance).

RELATED ART LIST (1) Japanese Patent Application Laid-Open No. 2004-127409.
(2) Japanese Patent Application Laid-Open No. Hei11-185209.
(3) Japanese Patent Application Laid-Open No. Hei11-266185.

Under these circumstances, the inventors have come to realize the following problem. Conventionally, baseline correction has been done by calculating the necessary amount of correction and feeding it back to a preceding stage, which results in a delay in the timing of correction as much as the time taken to calculate the amount of correction. And this delay can be fatal and unacceptable to storage apparatuses of recent years which must make access for read and write at a speed exceeding 1 G bps. In other words, a baseline correction, when done by the conventional method, can be inaccurate because the amount of correction to be used in the correction is based on past data. The problem therefore is that where access at higher speed is required, this baseline wander can adversely affect the subsequent circuits for error correction and the like.

SUMMARY OF THE INVENTION

The present invention has been made in view of the foregoing circumstances and a general purpose thereof is to provide a storage apparatus capable of correcting baseline wander efficiently, particularly for storage apparatuses required of making high-speed access.

In order to solve the above problem, a signal processing apparatus according to one embodiment of the present invention includes: a first baseline wander correcting unit which corrects baseline wander by a feedforward control, the first baseline wander correcting unit being provided in a processing path in which a predetermined processing is performed on an input signal; and a second baseline wander correcting unit, provided anterior to said first baseline wander unit, which corrects the baseline wander by a feedback control, wherein the first baseline wander correcting unit includes: a baseline wander derivation unit which derives an amount of baseline wander; a fine correction amount adjuster which calculates a value corresponding to an average value of the amount of baseline wander derived by the baseline wander derivation unit and fine-adjusts a correction amount of baseline; and a fine wander corrector which corrects the baseline wander by using the fine-adjusted baseline amount, and wherein the second baseline wander correcting unit includes: a coarse correction amount adjuster which calculates a value corresponding to an average value of the amount of baseline wander derived by the baseline wander derivation unit and coarse-adjusts a correction amount of baseline; and a coarse corrector which corrects the baseline wander by using the coarse-adjusted baseline amount.

According to this embodiment, the baseline wander is fine-corrected by the first baseline wander correcting unit and it is also coarse-corrected by the second baseline wander unit, so that the baseline wander can be corrected efficiently.

Another embodiment of the present invention relates also to a signal processing apparatus. This signal processing apparatus is characterized in that the first baseline correcting unit corrects the baseline wander by a feedforward control and the second baseline correcting unit corrects the baseline wander by a feedback control.

According to this embodiment, the first baseline wander correcting unit where the time delay may be problematic employs a feedforward control for the correction of baseline wander. Thus, the baseline can be corrected by tracking an instantaneous wander, if any.

Still another embodiment of the present invention relates also to a signal processing. This apparatus further includes: an A-D converter provided anterior to the second baseline wander correcting unit; and a third baseline wander correcting unit, provided anterior to the A-D converter, which corrects baseline wander of an analog signal by using an average value calculated by the coarse correction amount adjuster.

According to this embodiment, the baseline wander is coarse-corrected in the analog side, too, thus achieving further accurate correction.

Still another embodiment of the present invention relates also to a signal processing. This signal processing apparatus is characterized in that the first baseline wander correcting unit further includes a correction permission control unit which controls permission or rejection of correction, and the fine wander corrector corrects the baseline wander of the input signal, based on a control of the correction permission control unit.

According to this embodiment, the correction is made after whether the correction shall be made or not is decided, so that the correction can be done with accuracy.

Still another embodiment of the present invention relates also to a signal processing. This signal processing apparatus is characterized in that when it is determined by the correction permission control unit that correction of baseline wander is not required, the correction permission control unit disables the baseline correction by the fine wander corrector.

According to this embodiment, when it is determined that the correction is not needed, the correction is not effected. Thus, the wander of baseline can be corrected efficiently.

Still another embodiment of the present invention relates also to a signal processing apparatus. This signal processing apparatus is characterized in that when an amount of baseline wander is less than a threshold value, the correction permission control unit determines that the correction of baseline wander is not required.

According to this embodiment, whether the correction is to be performed or not is determined by a threshold value, so that the flexible control can be achieved.

Still another embodiment of the present invention relates also to a signal processing apparatus. This signal processing apparatus is characterized in that the fine correction amount adjuster includes a first averaging unit which calculates an average value of a signal in a first interval, and the coarse correction amount adjuster calculates an average value of a signal in a second interval. The second interval is longer than the first interval.

According to this embodiment, the amount of correction is derived using the average value. And the length of average interface is set to different values between the fine adjuster and the coarse adjuster. Thus, the fine adjuster can cope with an instantaneous wander whereas the coarse adjuster can cope with a long-term wander.

Still another embodiment of the present invention relates also to a signal processing apparatus. This signal processing apparatus is characterized in that the baseline wander derivation unit includes a slicer which performs a hard decision processing on a signal subjected to the predetermined processing; and a subtractor which subtracts the signal which has been hard-decision processed by the slicer, from the signal subjected to the predetermined processing.

According to this embodiment, the results of hard decision processing are used, so that the amount of variation can be obtained at high speed.

Still another embodiment of the present invention relates also to a signal processing apparatus. This signal processing apparatus is characterized in that the baseline wander derivation unit further includes a selector which receives the inputs of the signal subjected to the predetermined processing and the average value of the amount of baseline wander and which outputs either the signal subjected to the predetermined processing or the average value of the amount of baseline wander to the slicer, according to a predetermined selection signal.

According to this embodiment, the original signal from which the amount of wander has been calculated can be selected by the selector, so that the flexible control can be achieved. Also, the amount of wander can be derived with better accuracy because the original signal from which the amount of wander has been calculated is used as the output of the averaging unit.

Still another embodiment of the present invention relates to a signal processing method. This method is a signal processing method which includes first correcting baseline wander and second correcting baseline wander which is to be performed before the first correcting baseline wander, and the first correcting baseline wander includes: deriving an amount of baseline wander; calculating a value corresponding to an average value of the amount of baseline wander derived by the deriving an amount of baseline wander and fine-adjusting a correction amount of baseline; and correcting the baseline wander by using the fine-adjusted baseline amount, and the second correcting baseline wander includes: calculating a value corresponding to an average value of the amount of baseline wander derived by the deriving an amount of baseline wander and coarse-adjusting a correction amount of baseline; and correcting the baseline wander by using the coarse-adjusted baseline amount.

According to this embodiment, the baseline wander is fine-corrected by the first baseline wander correcting unit and it is also coarse-corrected by the second baseline wander unit, so that the baseline wander can be corrected efficiently.

Still another embodiment of the present invention relates to a storage system. This storage system has a write channel by which to write a data to storage apparatus and a read channel by which to read out the data stored in the storage apparatus, and the write channel includes: a first encoding unit which encodes data into a run length code; a second encoding unit which further encodes the data encoded by the first encoding unit, using a low-density parity check code; and a write unit which writes the data encoded by the second encoding unit to a storage apparatus, and the read channel includes: a plurality of baseline wander correcting units which correct baseline wander of the data read out of the storage apparatus; a soft-output detector which calculates the likelihood of the data whose baseline is corrected by the baseline wander correcting unit and which outputs a soft decision value; a second decoding unit, corresponding to the second encoding unit, which decodes the data outputted from the soft-output detector; and a first decoding unit, corresponding to the first encoding unit, which decodes the data decoded by the second decoding unit, wherein the plurality of baseline wander correcting units include: a first baseline wander correcting unit which corrects baseline wander by a feedforward control, the first baseline wander correcting unit being provided in a processing path in which a predetermined processing is performed on an input signal; and a second baseline wander correcting unit, provided anterior to the first baseline wander unit, which corrects the baseline wander by a feedback control, wherein the first baseline wander correcting unit includes a baseline wander derivation unit which derives an amount of baseline wander; a fine correction amount adjuster which calculates a value corresponding to an average value of the amount of baseline wander derived by the baseline wander derivation unit and fine-adjusts a correction amount of baseline; and a fine wander corrector which corrects the baseline wander by using the fine-adjusted baseline amount, and wherein the second baseline wander correcting unit includes: a coarse correction amount adjuster which calculates a value corresponding to an average value of the amount of baseline wander derived by the baseline wander derivation unit and coarse-adjusts a correction amount of baseline; and a coarse corrector which corrects the baseline wander by using the coarse-adjusted baseline amount.

According to this embodiment, since the baseline wander can be corrected efficiently, the effect of baseline wander upon a decoding unit or the like placed in a subsequent stage can be reduced and therefore access can be made to the storage system at higher speed.

Still another embodiment of the present invention relates also to a storage system. This storage system further includes: a storage apparatus which stores data; and a control unit which controls write of data to the storage apparatus and read of data from the storage apparatus, wherein the read channel reads out the data stored in the storage apparatus in accordance with an instruction from the control unit, and wherein the write channel writes the data to the storage apparatus in accordance with an instruction from the control unit.

According to this embodiment, since the baseline wander can be corrected efficiently, the effect of baseline wander upon a decoding unit or the like placed in a subsequent stage can be reduced and therefore access can be made to the storage system at higher speed.

Still another embodiment of the present invention relates to a semiconductor integrated circuit. This semiconductor integrated circuit is a semiconductor integrated circuit having a write channel for writing data to a storage apparatus and a read channel for reading out the data stored in the storage apparatus, the write channel includes: a first encoding unit which encodes data into a run length code; a second encoding unit which further encodes the data encoded by the first encoding unit, using a low-density parity check code; and a write unit which writes the data encoded by the second encoding unit to a storage apparatus, and the read channel includes: a plurality of baseline wander correcting units which correct baseline wander of the data read out of the storage apparatus; a soft-output detector which calculates the likelihood of the data whose baseline is corrected by the baseline wander correcting unit and which outputs a soft decision value; a second decoding unit, corresponding to the second encoding unit, which decodes the data outputted from the soft-output detector; and a first decoding unit, corresponding to the first encoding unit, which decodes the data decoded by the second decoding unit, wherein the plurality of baseline wander correcting units include: a first baseline wander correcting unit which corrects baseline wander by a feedforward control, the first baseline wander correcting unit being provided in a processing path in which a predetermined processing is performed on an input signal; and a second baseline wander correcting unit, provided anterior to the first baseline wander unit, which corrects the baseline wander by a feedback control, wherein the first baseline wander correcting unit includes a baseline wander derivation unit which derives an amount of baseline wander; a fine correction amount adjuster which calculates a value corresponding to an average value of the amount of baseline wander derived by the baseline wander derivation unit and fine-adjusts a correction amount of baseline; and a fine wander corrector which corrects the baseline wander by using the fine-adjusted baseline amount, and wherein the second baseline wander correcting unit includes: a coarse correction amount adjuster which calculates a value corresponding to an average value of the amount of baseline wander derived by the baseline wander derivation unit and coarse-adjusts a correction amount of baseline; and a coarse corrector which corrects the baseline wander by using the coarse-adjusted baseline amount. The circuit is integrally integrated on at least a single semiconductor substrate.

According to this embodiment, the baseline wander can be corrected efficiently. As a result, the effect of baseline wander upon a decoding unit or the like provided in a subsequent stage can be reduced. This eliminates the necessity of having extraneous hardware mounted therein and therefore a low-scale integrated circuit can be achieved.

Arbitrary combinations of the aforementioned constituting elements, and the implementation of the present invention in the form of a method, an apparatus, a system and so forth may also be effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

With reference to figures, a description will be given hereinbelow of specific modes of carrying out the present invention (hereinafter referred to as "embodiment" or "preferred embodiments").

First Embodiment

Before explaining a first embodiment of the present invention in concrete terms, a brief description will be given of a storage apparatus relating to the present embodiment. A storage apparatus according to the present embodiment includes a hard disk controller, a magnetic disk apparatus, and a read/write channel, which includes a read channel and a write channel. At the read channel, correction of the above-mentioned baseline wander is made on the data read out from the magnetic disk apparatus by a feedforward control. By this arrangement, it is possible to correct baseline wander efficiently without the effects of delay occurring at the time of correction even when there is instantaneously a large wandering of baseline. This will be described in detail later.

Figure 1:
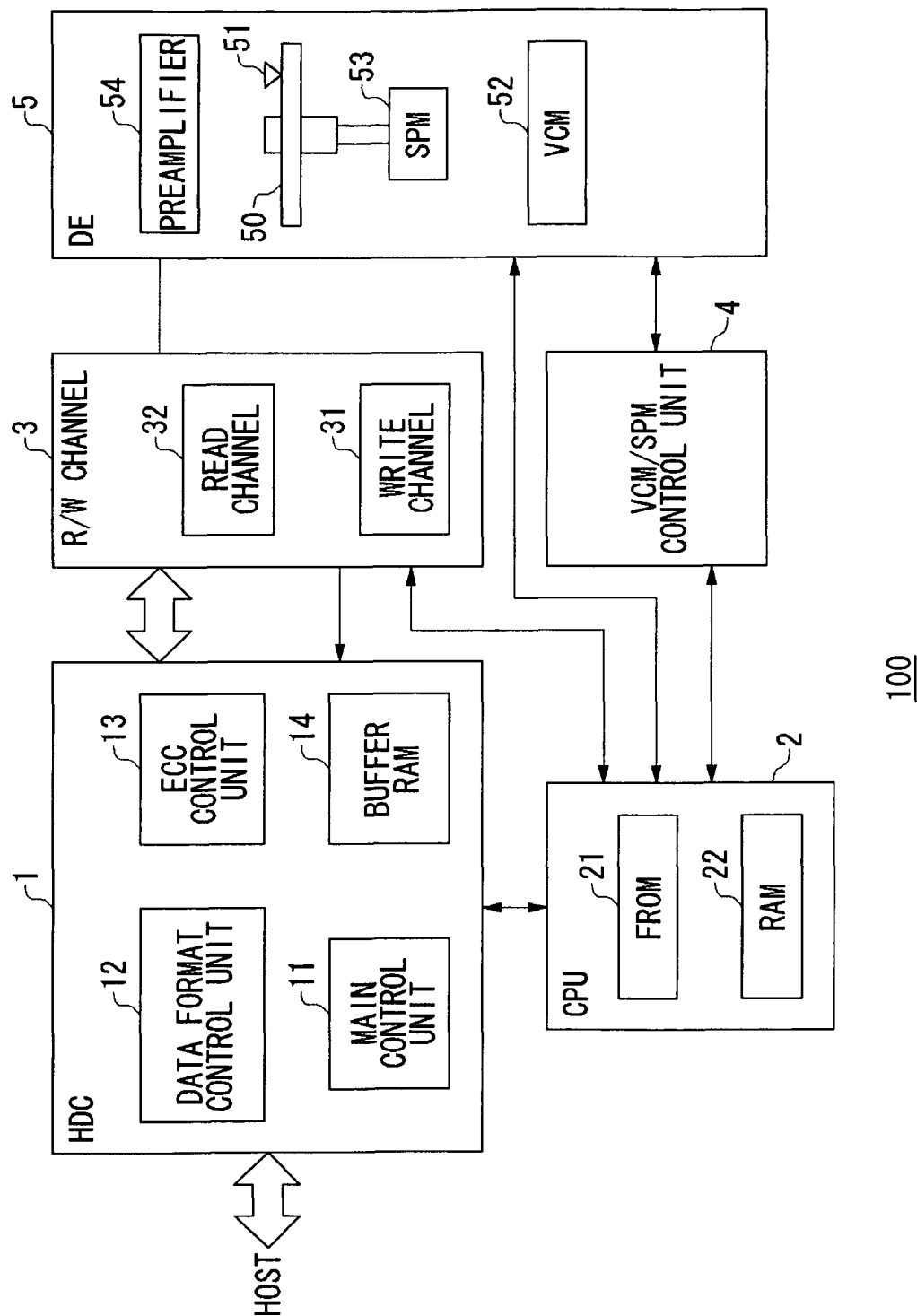
FIG. 1 illustrates a structure of a magnetic disk apparatus according to a first embodiment of the present invention.

FIG. 1 illustrates a structure of a magnetic disk apparatus 100 according to a first embodiment of the present invention. The magnetic disk apparatus 100 in FIG. 1 is comprised roughly of a hard disk controller 1 (hereinafter abbreviated as "HDC 1"), a central processing arithmetic unit 2 (hereinafter abbreviated as "CPU 2"), a read/write channel 3 (hereinafter abbreviated as "R/W channel 3"), a voice coil motor/spindle motor controller 4 (hereinafter abbreviated as "VCM/SPM controller 4"), and a disk enclosure 5 (hereinafter abbreviated as "DE 5"). Generally, an HDC 1, CPU2, R/W channel 3, and VCM/SPM controller 4 are structured on a single substrate.

The HDC 1 includes a main control unit 11 for controlling the whole HDC 1, a data format control unit 12, an error correction encoding control unit 13 (hereinafter abbreviated as "ECC control unit 13"), and a buffer RAM 14. The HDC 1 is connected to a host system via a not-shown interface unit. It is also connected to the DE 5 via the R/W channel 3, and carries out data transfer between the host and the DE 5 according to the control by the main control unit 11. Inputted to this HDC 1 is a read reference clock (RRCK) generated by the R/W channel 3. The data format control unit 12 converts the data transferred from the host into a format that is suited to record it on a disk medium 50 and also converts the data reproduced by the disk medium 50 into a format that is suited to transfer it to the host. The disk medium 50 includes a magnetic disk, for example. The ECC control unit 13 adds redundancy symbols, using data to be recorded as information symbols, in order to correct and detect errors contained in data reproduced by the disk medium 50. The ECC control unit 13 also determines if any error has occurred in reproduced data and corrects or detects the error if there is any. It is to be noted here that the number of symbols capable of error correction is limited and is relative to the length of redundancy data. In other words, addition of a larger amount of redundancy data may cause the format efficiency to drop, thus trading off with the number of symbols capable of error correction. If error correction is done using the Reed-Solomon code for ECC, the number of errors correctable will be "Number of redundancy symbols/2". The buffer RAM 14 stores temporarily data transferred from the host and transfers it to the R/W channel 3 with proper timing. Also, the buffer RAM 14 stores temporarily the read data transferred from the R/W channel 3 and transfers it to the host with proper timing after the completion of ECC decoding or the like.

The CPU 2 includes a flash ROM 21 (hereinafter abbreviated as "FROM 21") and an RAM 22, and is connected to the HDC 1, R/W channel 3, VCM/SPM controller 4, and DE 5. The FROM 21 stores an operation program for the CPU 2.

The R/W channel 3, which is roughly divided into a write channel 31 and a read channel 32, transfers data to be recorded and reproduced data to and from the HDC 1. Connected to the DE 5, the R/W channel 3 also performs transmission of recorded signals and reception of reproduced signals. This will be described in detail later.

The VCM/SPM controller 4 controls a voice coil motor 52 (hereinafter abbreviated as "VCM 52") and a spindle motor 53 (hereinafter abbreviated as "SPM 53") in the DE 5.

The DE 5, which is connected to the R/W channel 3, performs reception of recorded signals and transmission of reproduced signals. The DE 5 is also connected to the VCM/SPM controller 4. The DE 5 includes a disk medium 50, a head 51, a VCM 52, an SPM 53, and a preamplifier 54. In a magnetic disk apparatus 100 as shown in FIG. 1, it is so assumed that there is one disk medium 50 and the head 51 is disposed only on one side of the disk medium 50, but the arrangement may be such that a plurality of disk mediums 50 are formed in a stacked structure. Also, it should be understood that the head 51 is generally provided one for each face of the disk medium 50. The recorded signals transmitted from the R/W channel 3 are supplied to the head 51 by way of the preamplifier 54 in the DE 5 and then recorded on the disk medium 50 by the head 51. Conversely, the signals reproduced from the disk medium 50 by the head 51 are transmitted to the R/W channel 3 by way of the preamplifier 54. The VCM 52 in the DE 5 moves the head 51 in a radial direction of the disk medium 50 so as to position the head 51 at a target position on the disk medium 50. The SPM 53 rotates the disk medium 50.

Figure 2:
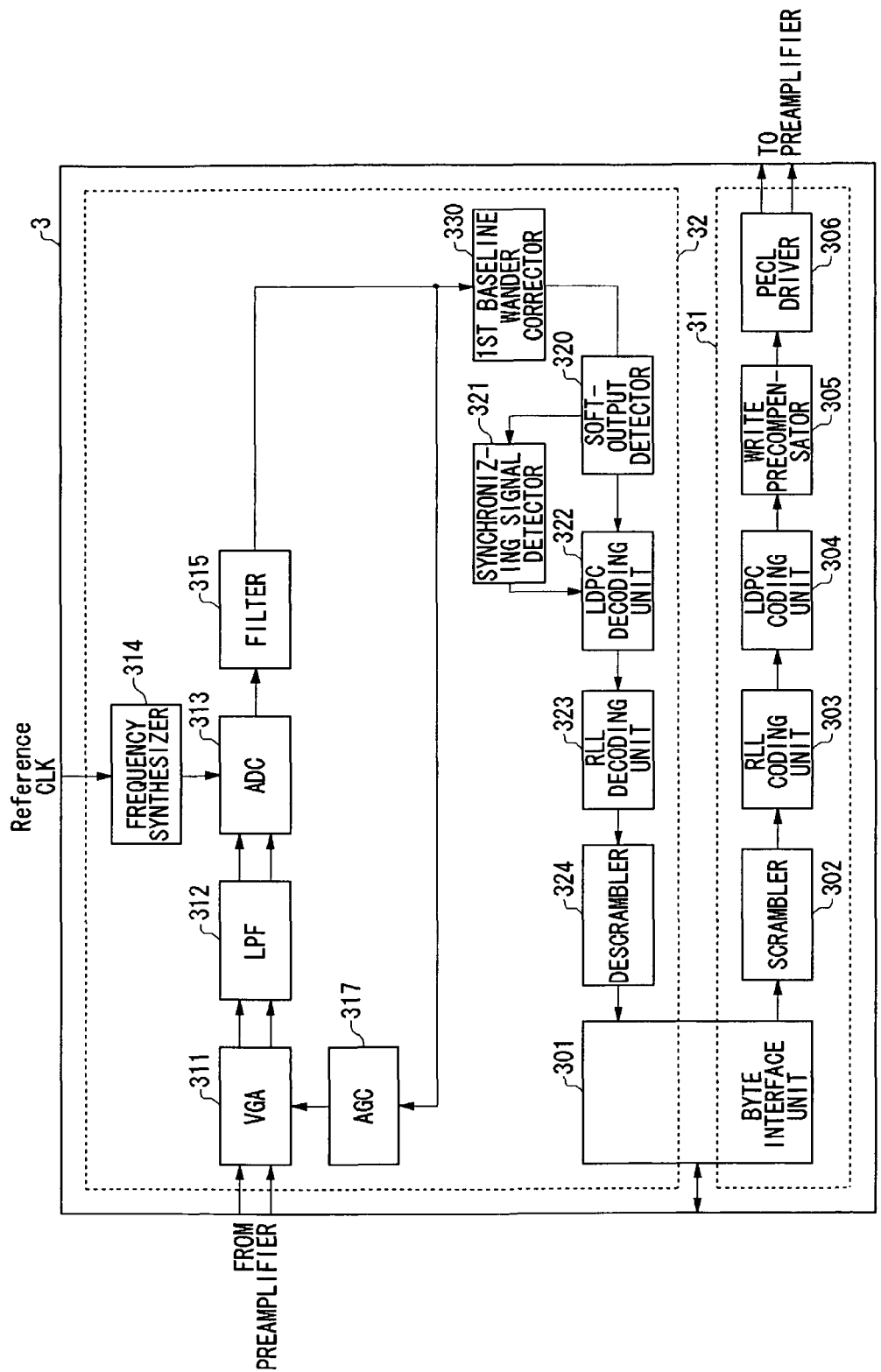
FIG. 2 illustrates a structure of an R/W channel 3 shown in FIG. 1.

Referring now to FIG. 2, a description will be given of an R/W channel 3. FIG. 2 illustrates a structure of an R/W channel 3 as shown in FIG. 1. The R/W channel 3 is comprised roughly of a write channel 31 and a read channel 32.

The write channel 31 includes a byte interface unit 301, a scrambler 302, a run-length limited encoding unit 303 (hereinafter abbreviated as "RLL encoding unit 303"), a low-density parity check encoding unit 304 (hereinafter abbreviated as "LDPC encoding unit 304"), a write compensation unit 305 (hereinafter referred to as "write precompensator 305"), and a driver 306.

At the byte interface unit 301, data transferred from the HDC 1 are processed as input data. Data to be written onto the medium are inputted from the HDC 1 sector by sector. At this time, not only user data (512 bytes) for one sector but also ECC bytes added by the HDC 1 are also inputted simultaneously. The data bus, which is normally 1 byte (8 bits) long, is processed as input data by the byte interface unit 301. The scrambler 302 converts write data into a random sequence. The repetition of data of the same pattern is designed to remove any adverse effects on detection performance at reading, which may raise the error rate. The RLL encoding unit 303 is used to limit the maximum run length. By limiting the maximum run length of "0", data are turned into a data sequence appropriate for an automatic gain controller 317 (hereinafter abbreviated as "AGC 317") and the like at reading.

The LDPC encoding unit 304 plays a role of generating a data sequence containing parity bits, which are redundancy bits, by LDPC encoding. The LDPC encoding is done by multiplying a matrix of k×n, called a generator matrix, by a data sequence of length k from the left. The elements contained in a check matrix (parity check matrix) H corresponding to the generator matrix are "0" or "1", and the encoding is called "low-density parity check encoding because the number of 1's is smaller than the number of 0's. By utilizing the arrangement of these 1's and 0's, error correction will be carried out efficiently by an LDPC decoding unit 322, which will be described later.

The write precompensator 305 is a circuit for compensating the nonlinear distortion resulting from the continuation of magnetization transition on the medium. The write precompensator 305 detects a pattern necessary for compensation from write data and preadjusts the write current waveform in such a manner as to cause magnetization transition in correct positions. The driver 306 outputs signals corresponding to the pseudo ECL level. The output from the driver 306 is sent to the not-shown DE 5 and then sent to the head 51 by way of the preamplifier 54 before the write data are recorded on the disk medium 50.

The read channel 32 includes a variable gain amplifier 311 (hereinafter abbreviated as "VGA 311"), a low-pass filter 312 (hereinafter abbreviated as "LPF 312"), an AGC 317, an analog-to-digital converter 313 (hereinafter abbreviated as "ADC 313"), a frequency synthesizer 314, a filter 315, a soft-output detector 320, an LDPC decoding unit 322, a synchronizing signal detector 321, a run-length limited decoding unit 323 (hereinafter abbreviated as "RLL decoding unit 323"), a descrambler 324, and a first baseline wander corrector 330.

The VGA 311 and AGC 317 adjust the amplitude of the read waveform of data sent from a not-shown preamplifier 54. The AGC 317 compares an actual amplitude with an ideal amplitude and determines a gain to be set for the VGA 311. The LPF 312, which can adjust the cut-off frequency and boost amount, plays a partial role in reducing high-frequency noise and performing equalization on a partial response (hereinafter abbreviated as "PR") waveform. In the equalization to a PR waveform by the LPF 312, it is difficult to carry out a perfect equalization of analog signals by an LPF because of a number of factors including variation in head lift, non-uniformity of the medium, and variation in motor speed. Hence, equalization to the PR waveform is attempted again by a filter 315 located in a subsequent position and having greater flexibility. The filter 315 may have a function of adjusting its tap coefficient in an adaptable manner. The frequency synthesizer 314 generates a sampling clock for the ADC 313. The ADC 313 is of a structure to acquire a synchronous samples directly by A-D conversion. Note that in addition to this structure, the structure may be one to acquire an asynchronous samples by A-D conversion. In such a case, a zero phase restarter, a timing controller, and an interpolation filter may be further provided in positions subsequent to the ADC 313. Since a synchronous sample needs to be obtained from the asynchronous sample, such a function is performed by these blocks. The zero phase restarter, which is a block for determining an initial phase, is used to acquire a synchronous sample as quickly as possible. After the determination of the initial phase, the timing controller detects a phase shift by comparing an actual sample value against an ideal sample value. Then, the phase shift is used to determine the parameter for the interpolation filter, and thus a synchronous sample can be obtained.

The first baseline wander corrector 330 corrects the wandering of baseline by a feedforward control. This will be described in detail later.

The soft-output detector 320 uses a Soft-Output Viterbi Algorithm (hereinafter abbreviated as "SOVA"), a kind of Viterbi algorithm, in order to avoid the deterioration of decoding characteristics resulting from intersymbol interference. In other words, there is a problem of deteriorating decoding characteristics as a result of increased interference between recorded encodes along with the rise in recording density of magnetic disk apparatuses in recent years, and a Partial Response Maximum Likelihood (hereinafter abbreviated as "PRML") method, which is based on the partial response due to intersymbol interference, is used as a method to overcome the problem. The PRML method is a method for obtaining a signal sequence that maximizes the likelihood of the partial response of reproduced signals. The output from the soft-output detector 320 can be used as the soft-value input to the LDPC decoding unit 322. Let us assume, for instance, that soft-values (0.71, 0.18, 0.45, 0.45, 0.9) have been outputted as SOVA output. These values numerically represent their likelihood of being "0" or their likelihood of being "1". For example, the first value of 0.71 signifies a strong likelihood of being 1, whereas the fourth value of 0.45 is more likely to be 0 but is also significantly likely to be 1. The output of a conventional Viterbi detector is hard values, which are the results of hard decision of SOVA output. In the above case, the values will be (1, 0, 0, 0, 1). The hard values, which represent either 0 or 1, no longer has the information suggesting the likelihood of being 0 or 1. Accordingly, the inputting soft values to the LDPC decoding unit 322 can realize better decoding characteristics.

The LDPC decoding unit 322 plays a role of restoring an LDPC-encoded data sequence to the sequence before the LDPC encoding. The principal methods for such decoding are the sum-product decoding method and the min-sum decoding method. While the sum-product decoding method gives a better decoding performance, the min-sum decoding method can be better realized by hardware. In the actual decoding by the use of the LDPC code, a fairly satisfactory decoding performance can be accomplished by carrying out the iterative decoding between the soft-output detector 320 and the LDPC decoding unit 322. In practice, therefore, the soft-output detector 320 and the LDPC decoding unit 322 need to be arranged in multiple stages. Generally speaking, in an LDPC decoding, values called a priori probability and a posteriori probability are obtained, and the priori probability and the posteriori probability are calculated again through the mediation of a digital aided equalizer (hereinafter abbreviated as "DAE"). At a predetermined count or when it is determined that errors are no longer present, the likelihood found at that point undergoes a hard decision, and binary decoded data are outputted. Here, the absence of errors can be determined by seeing whether the result of multiplying the decoded data containing a redundancy data sequence by a check matrix (parity check matrix) is a zero matrix or not. That is, if the result is a zero matrix, it is determined that no errors remain in the decoded data as a result of correction, and if the result is other than a zero matrix, it is determined that there are still errors in the decoded data which have not yet been corrected. In another method for determining that there are no longer errors remaining, redundancy bits are obtained by multiplying a data sequence excluding the redundancy data sequence by a generator matrix used at the LDPC encoding. Then the redundancy bits undergoes a hard decision, a comparison is made against the redundancy data sequence, and it is determined whether the errors have been corrected or not by verifying if there is agreement therebetween. The hard decision meant here is, for instance, the determination of "1" when the value is larger than a predetermined threshold value and of "0" when it is smaller than that.

The synchronizing signal detector 321 plays a role of recognizing the top position of data by detecting the sync mark added to the top of data. The RLL decoding unit 323 restores the data outputted from the LDPC decoding unit 322 to the original data sequence by carrying out a reverse operation of the RLL encoding unit 303 of the write channel 31 thereon. The descrambler 324 restores the original data sequence by carrying out a reverse operation of the scrambler 302 of the write channel 31. The data generated here are transferred to the HDC 1.

Figure 3:
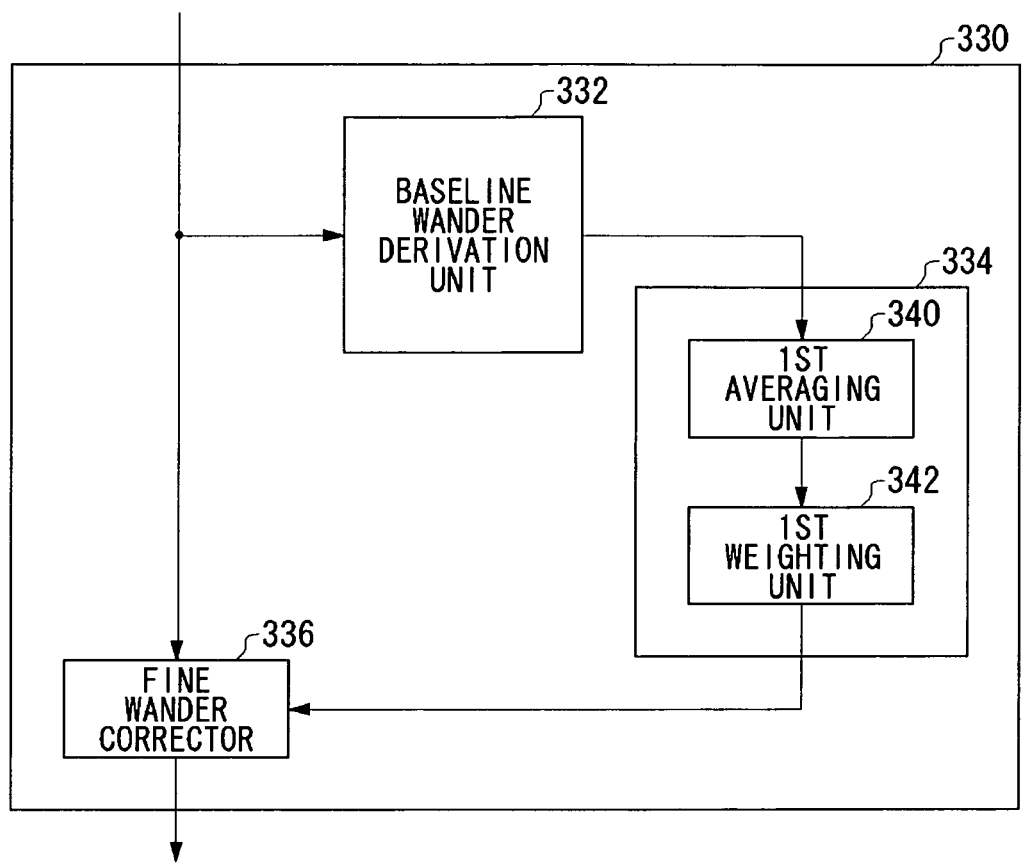
FIG. 3 illustrates a structure of a first baseline wander corrector shown in FIG. 2.

A description will now be given of a first baseline wander corrector 330. FIG. 3 illustrates a structure of a first baseline wander corrector 330 as shown in FIG. 2. The first baseline wander corrector 330 includes a baseline wander derivation unit 332, a fine wander adjuster 334, and a fine wander corrector 336.

Figure 4:
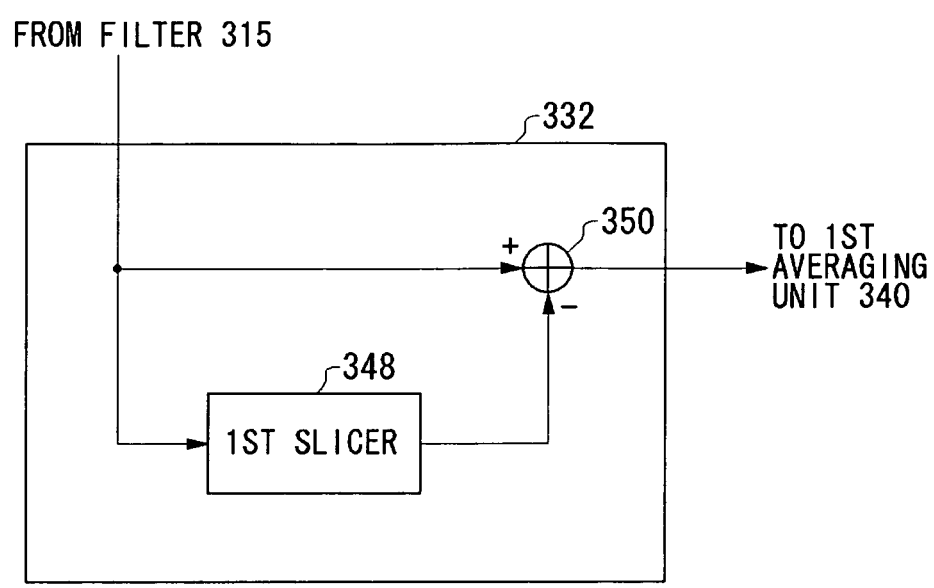
FIG. 4 illustrates a structure of a baseline wander derivation unit shown in FIG. 3.

FIG. 4 illustrates a structure of a baseline wander derivation unit 332 as shown in FIG. 3. The baseline wander derivation unit 332 includes a first slicer 348 and a first fine correction amount calculator 350. The baseline wander derivation unit 332 first carries out a hard decision of three values using the signal outputted from the filter 315 as the input to the first slicer 348, thereby determining whether the value is near plus or minus zero, on the plus side, or on the minus side. Then, the distance to any one of the three values is derived by finding the difference between the signal outputted from the filter 315 and the value obtained by the tree-value decision at the first fine correction amount calculator 350.

The three values are, for example, "0", which is the intermediate value of the output of the not-shown ADC 313, "0+α", which is a threshold value α added to 0, and "0−α", which is the threshold value α subtracted from 0. If α is 1, for instance, then they will be the three values of (−1, 0, +1). The hard decision of three values is, for example, a decision that the data subjected to the hard decision is "the minimum value of ADC 313" when it is less than half of the minimum value of ADC 313, "the maximum value of ADC 313" when it is more than half of the maximum value of ADC 313, and "±0" for all the cases other than the above. For instance, the hard decision of three values when the maximum value of ADC 313 is "+1" and the minimum value thereof is "−1" will be "−1" when the data subjected to the decision is "−0.5" or below, "+1" when it is "0.5" or above, or "±0" when it is greater than "−0.5" and less than "0.5".

By making a hard decision as described above, it is determined which of the plus or minus side the data subjected to the hard decision is shifted to, and thereupon the distance to the value is obtained by the first fine correction amount calculator 350. Then the moving average of the distance is calculated by a first averaging unit 340, which will be described later, so as to determine the degree and trend of variation in the signals. Generally speaking, if the output signal sequence of an ADC 313 (not shown in FIG. 3) is observed for a long interval, the counts of "+1" and "−1" will be about the same. Accordingly, when the averaging is done for a long interval, the average value should ideally be "±0". However, wander of baseline, if any, brings about a phenomenon of the "±0" at the ADC 313 shifted to the plus side or the minus side, so that averaging cannot produce "±0". In other words, this average value is no different from the amount of wander in baseline, and thus the baseline wander can be corrected by the use of this average value.

Wander of baseline meant here is, for instance, a shift of the baseline, or the value of "±0" at the ADC 313, to the plus side or the minus side. For example, if there is a shift of "+1" in the plus direction, then data D1, whose original value is "−1", will be judged as "0", and data D2, whose original value is "0", as "+1". In other words, the data D1, which should be "−1", becoming "0" due to the wander of baseline may work such that the "0" inputted to the not-shown soft-output detector 320 in a subsequent position causes an error in the processing at the soft-output detector 320 and further makes difficult the decision of "1" or "−1" at the LDPC decoding unit 322 or the like in a subsequent position. Moreover, the data D2, which should be "0" but can be either "+1" or "−1", will be judged only as "+1". In such a case, it may so happen at the LDPC decoding unit 322 or the like in a subsequent position that the data D1 is outputted as either "−1" or "1" and the data D2 is judged to be "+1". When there is no wandering of baseline, the data D1 is always judged as "−1" and the data D2 is judged as either "+1" or "−1", and therefore there may arise disagreement in the outputted results. Such development may reduce the decoding performance at the LDPC decoding unit 322 or cause a delay due to an increased number of repetition, which will eventually lead to a drastically lowered data read speed. To solve this problem, the arrangement according to the present invention is such that even when there is an instantaneously large wander of baseline, a follow-up correction can be made by the aforementioned feedback control, with the result that the performance of the soft-output detector 320, the LDPC decoding unit 322, and the storage apparatus incorporating them has been improved.

Next, a description will be given of a fine wander adjuster 334. The fine wander adjuster 334 includes a first averaging unit 340 and a first weighting unit 342. The first averaging unit 340 acquires an average value for a predetermined interval. Since the baseline correction according to the present embodiment aims to follow up instantaneous wandering, the averaging processing employed by the first averaging unit 340 is not an interval averaging but a moving averaging. The first weighting unit 342 acquires the amount of fine correction by multiplying the average value outputted from the first averaging unit 340 by a predetermined weighting factor. The weighting factor is preferably "1" or below because the first baseline wander corrector 330 performs correction by a feedforward control.

Next, a description will be given of a fine wander corrector 336. The fine wander corrector 336 carries out fine correction of baseline wander through a process of subtracting the amount of fine correction determined by the fine wander adjuster 334 from the output of the filter 315.

It is to be noted here that the averaging interval used by the first averaging unit 340 may be one given from the outside or may be one to be changed dynamically. Also, the weighting factor used by the first weighting unit 342 may be one given from the outside or may be one to be changed dynamically.

Figure 5:
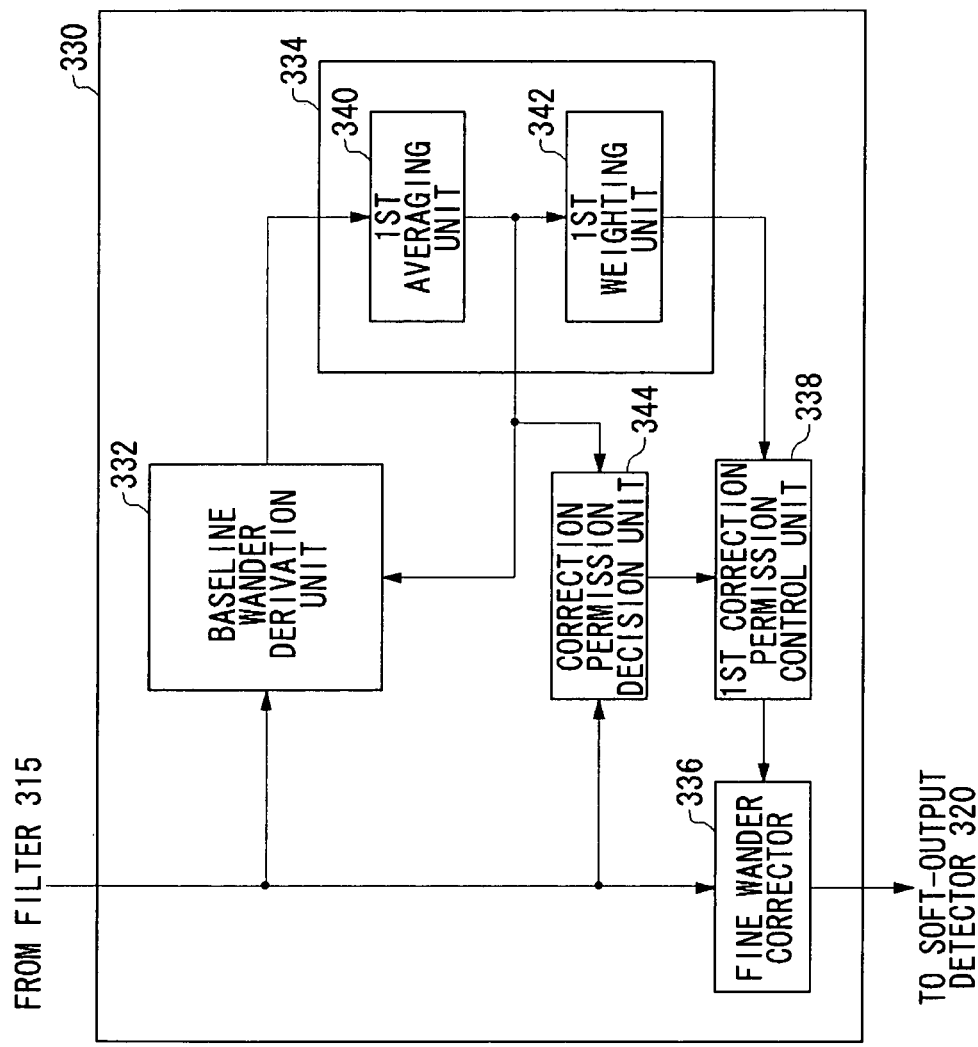
FIG. 5 illustrates a modification of a structure of a first baseline wander corrector shown in FIG. 2.

A description will now be given of a modification of a first baseline wander corrector 330. FIG. 5 illustrates a modification of a structure of a first baseline wander corrector 330 as shown in FIG. 2. Note that the same components as those in FIG. 3 are denoted with the same reference numerals and their repeated explanation is omitted here. The difference from FIG. 3 lies in that the first baseline wander corrector 330 further includes a first correction permission control unit 338 and a correction permission decision unit 344. Another difference lies in that the baseline wander derivation unit 332 uses the outputted result from the first averaging unit 340 as one of the inputs.

Figure 6:
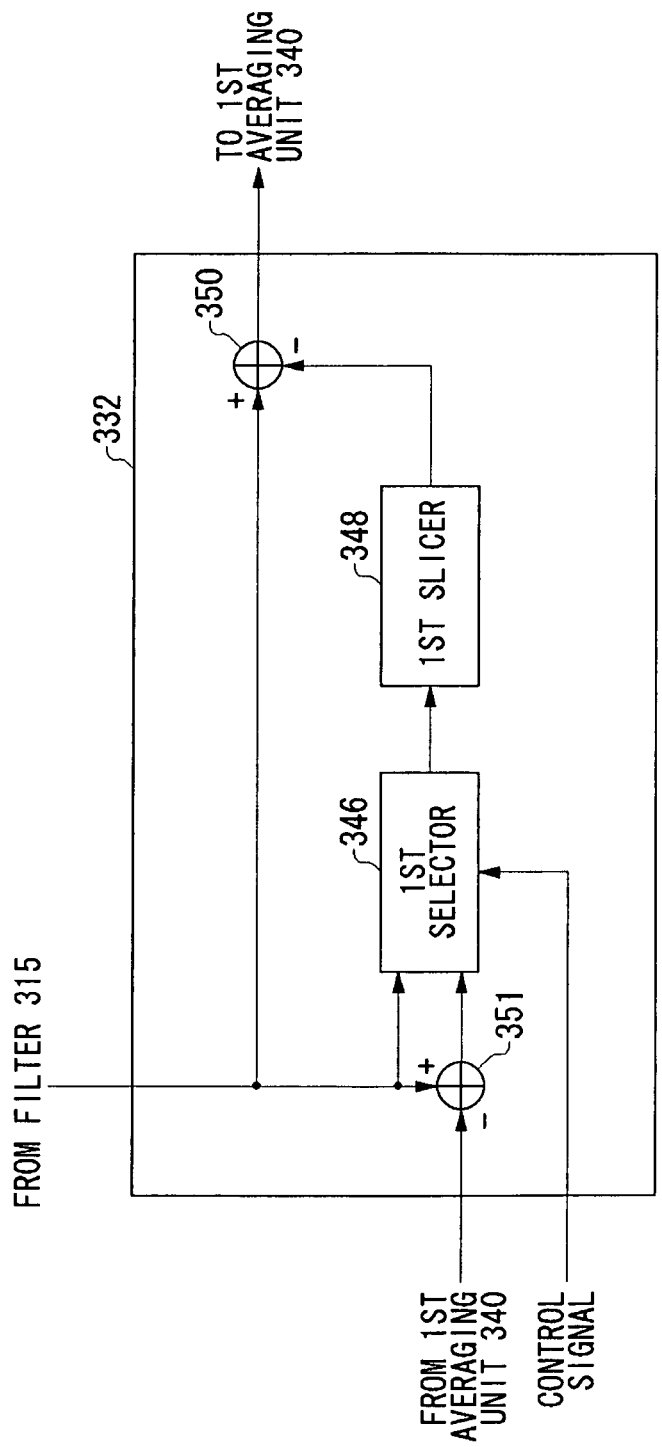
FIG. 6 illustrates a structure of a baseline wander derivation unit shown in FIG. 5.

FIG. 6 illustrates a structure of a baseline wander derivation unit 332 as shown in FIG. 5. The baseline wander derivation unit 332 includes a first selector 346, a first slicer 348, a first fine correction amount calculator 350, and a second fine correction amount calculator 351. The baseline wander derivation unit 332 of FIG. 6 firstly receives an output signal from the filter 315 and an average value, which is the output from the first averaging unit 340 shown in FIG. 5, as inputs to the first selector 346. The first selector 346 outputs either value of the signal outputted from the filter 315 and the corrected value of the output signal of the filter 315 to the first slicer 348, according to the control signal inputted from the outside. The correction here is carried out by the second fine correction amount calculator 351, which subtracts the output of the first averaging unit 340 shown in FIG. 5 from the output from the filter 315. The explanation of the first slicer 348 and the first fine correction amount calculator 350 is omitted because they are the same as those previously explained.

In this manner, the amount of fine correction can be calculated with greater accuracy by using the value of the output signal from the filter 315 corrected by the average value outputted from the first averaging unit 340 instead of the output signal from the filter 315 itself. The arrangement like this is employed because the output signal from the filter 315, at this stage, still contains baseline wander and thus is not considered an accurate value. Acquiring the amount of fine correction by the first slicer 348 and the first fine correction amount calculator 350 using the value after the correction of baseline wander by averaging instead of using the output signal of the filter 315 is equal to gaining the effect of correcting the amount of fine correction. This arrangement accomplishes an accurate baseline wander correction by acquiring a more accurate amount of fine correction.

Figure 7:
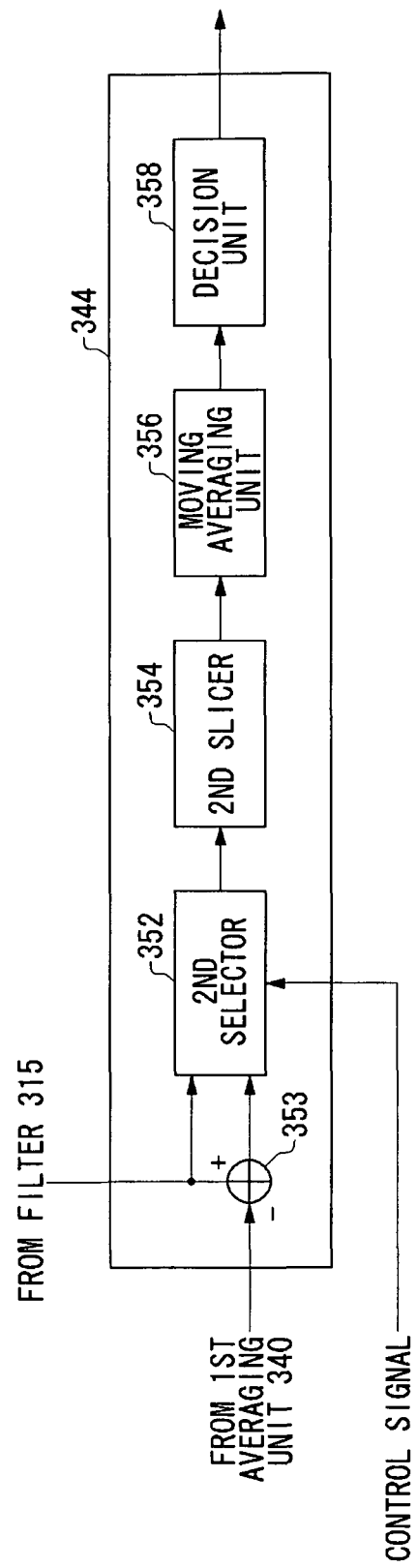
FIG. 7 illustrates a structure of a correction permission decision unit shown in FIG. 5.

FIG. 7 illustrates a structure of a correction permission decision unit 344 as shown in FIG. 5. The correction permission decision unit 344, which is a circuit to determine whether to carry out the correction of baseline wander or not, includes a second selector 352, a second slicer 354, a moving averaging unit 356, a decision unit 358, and a third fine correction amount calculator 353. Firstly the second selector 352 outputs either value of the output signal from the filter 315 and the corrected value of the output signal of the filter 315 to the second selector 352, according to the control signal inputted from the outside. The correction here is carried out by the third fine correction amount calculator 353, which subtracts the output signal of the first averaging unit 340 from the output signal from the filter 315. For the same reason as for the aforementioned first selector 346, it is so arranged that the second selector 352 can select the output signal of the first averaging unit 340. Then, similarly to the aforementioned first slicer 348, the second slicer 354 makes a hard decision on the signal outputted from the second selector 352. The moving averaging unit 356 obtains a moving average of the signals having been subjected to a hard decision. The decision unit 358 compares the moving-averaged value against a predetermined threshold value and outputs a signal indicating whether the baseline wander has to be corrected or not.

To be more precise, a signal permitting the correction of baseline wander, which is assumed to be present, is outputted when the hard decision at the second selector 352 has been one of the three values of (−1, 0, +1) and besides the result of the hard decision is other than "0". And when the result of the hard decision is "±0", it is assumed that there has been no baseline wander, and thus a signal rejecting the permission for correction is outputted. It is to be noted here that a correction, if made without the presence of baseline wander, can instead cause some additional baseline wander. Therefore, the arrangement according to the present embodiment is such that correction is not permitted when the result of the hard decision is "0". However, due to the effect of noise and the like, the amount of fine correction calculated by the baseline wander derivation unit 332 of FIG. 5 rarely becomes "0". Hence, when the output value of the moving averaging unit 356 is "0±α", the "α" being a threshold value, a signal rejecting the permission for correction is outputted. And when it is not so, a signal indicating the permission for correction is outputted. Also, two threshold values of α and β may be used, and when the output value is larger than "0−β" and smaller than "0+α", a decision on the permission for correction may be made on the assumption that there has been no baseline wander. Also, these threshold values may be predetermined, or they may be ones to be specified from the outside or ones changing dynamically. In any of such cases, a similar advantageous effect can be achieved.

The first correction permission control unit 338 selects a signal to be outputted to the fine wander corrector 336, according to the decision result by the correction permission decision unit 344. More specifically, when the decision result by the correction permission decision unit 344 is a signal indicating the permission for correction, the output result of the fine wander adjuster 334 is directly outputted to the fine wander corrector 336. And if it is a signal rejecting the permission for correction, "±0" is outputted to the fine wander corrector 336. The fine wander corrector 336 carries out fine correction of baseline wander by subtracting the output signal of the first correction permission control unit 338 from the output signal of the filter 315.

According to the present embodiment, even when there has been an instantaneously large wander of baseline, the baseline wander can be efficiently corrected without being affected by the delay resulting at the correction. Moreover, the amount of fine correction can be calculated with greater accuracy by correcting the amount of wander using an average value selected according to a selection signal from the outside and correcting the baseline wander using the thus corrected amount of wander. Also, the effect of error correction can be improved by correcting the baseline wander with better accuracy. Furthermore, the improved effect of error correction can realize a high-speed read and write control for the storage apparatus.

In the present embodiment, a description has been given with reference to FIG. 5 that the output signal of the first averaging unit 340 is inputted as one of the inputs of the baseline wander derivation unit 332 and as one of the inputs of the correction permission decision unit 344. However, the arrangement is not limited thereto, and the output signal of the first weighting unit 342 may be inputted to the baseline wander derivation unit 332 and the correction permission decision unit 344. In this case, too, a similar advantageous effect can be achieved. Also, with reference to FIG. 6, a description has been given that a signal, which is the output signal from the filter 315 corrected by the output signal of the first averaging unit 340, is inputted as one of the inputs of the first selector 346. However, the arrangement is not limited thereto, and a signal, which is the output signal from the filter 315 corrected by the output signal of the first weighting unit 342, may be inputted as one of the inputs of the first selector 346. In this case, too, a similar advantageous effect can be achieved. Also, with reference to FIG. 7, a description has been given that a signal, which is the output signal from the filter 315 corrected by the output signal of the first averaging unit 340, is inputted as one of the inputs of the second selector 352. However, the arrangement is not limited thereto, and a signal, which is the output signal from the filter 315 corrected by the output signal of the first weighting unit 342, may be inputted as one of the inputs of the second selector 352. In this case, too, a similar advantageous effect can be achieved.

Second Embodiment

Before explaining a second embodiment of the present invention in concrete terms, a brief description will be given of a storage apparatus relating to the present embodiment. A storage apparatus according to the present embodiment includes a hard disk controller, a magnetic disk apparatus, and a read/write channel, which includes a read channel and a write channel. At the read channel, correction of the above-mentioned baseline wander is made on the data read out from the magnetic disk apparatus by a feedforward control, and the baseline wander is also corrected by a feedback control at a stage posterior to an A-D converter. By employing this structure, it is possible to correct baseline wander efficiently and accurately without the effects of delay occurring at the time of correction not only when there is a large instantaneous wander of baseline but also when the baseline varies gradually over a long period of time. This will be described in detail later.

Figure 8:
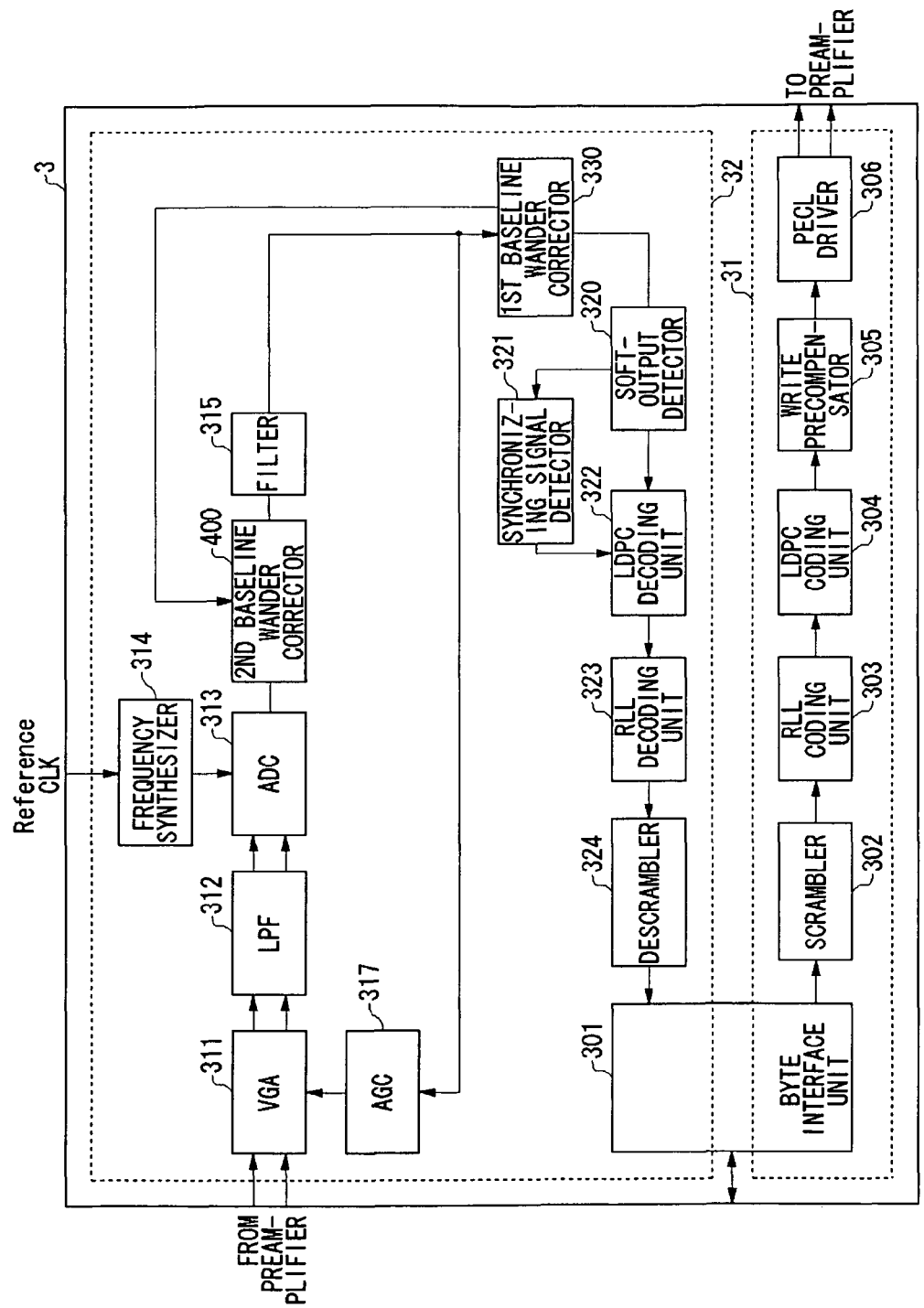
FIG. 8 illustrates a structure of an R/W channel according to a second embodiment of the present invention.

FIG. 8 illustrates a structure of an R/W channel 3 according to the second embodiment. The R/W channel 3 is comprised roughly of a write channel 31 and a read channel 32. The read channel 32 includes a VGA 311, an LPF 312, an AGC 317, an ADC 313, a frequency synthesizer 314, a filter 315, a soft-output detector 320, an LDPC decoding unit 322, a synchronizing signal detector 321, a run-length limited decoding unit 323, a descrambler 324, a first baseline wander corrector 330, and a second baseline wander corrector 400. Note that except for the second baseline wander corrector 400, the same components as those in FIG. 2 are denoted with the same reference numerals and the description thereof will be omitted here.

Figure 9:
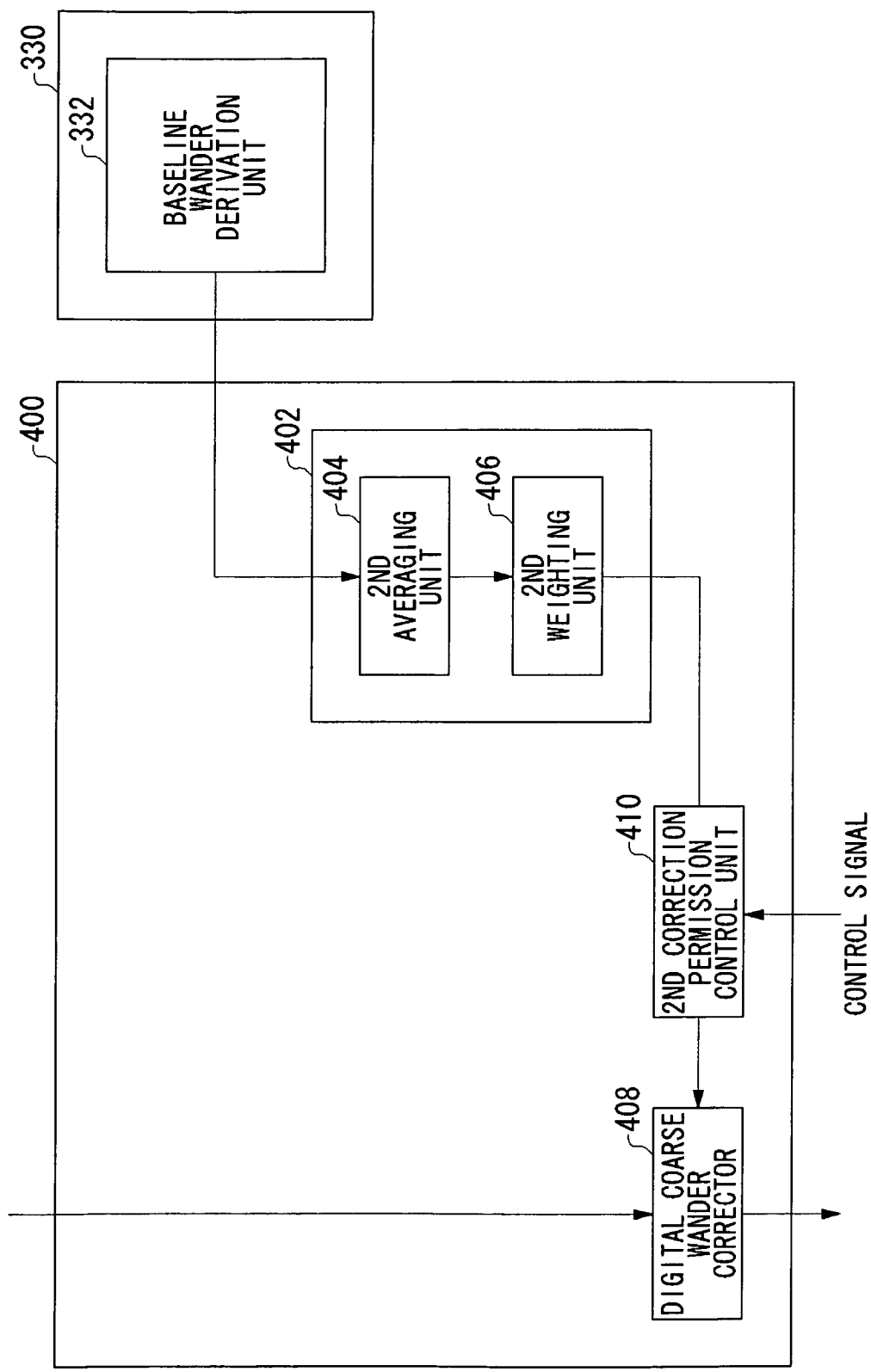
FIG. 9 illustrates a structure of a second baseline wander corrector shown in FIG. 8.

FIG. 9 illustrates a structure of a second baseline wander corrector 400 as shown in FIG. 8. The second baseline wander corrector 400 includes a digital coarse wander adjuster 402, a digital coarse wander corrector 408, and a second correction permission control unit 410. And the digital coarse wander adjuster 402 includes a second averaging unit 404 and a second weighting unit 406.

The digital coarse wander adjuster 402 includes a second averaging unit 404 and a second weighting unit 406. The second averaging unit 404 acquires an average value in an interval of a predetermined length, using the output signal of a coarse correction amount calculator 418 of a baseline wander derivation unit 332 to be described later as the input. This average value may be obtained by moving averaging. The second weighting unit 406 acquires the amount of digital coarse correction by multiplying the average value outputted from the second averaging unit 404 by a predetermined weighting factor. Note that the averaging interval length at the second averaging unit 404 is preferably greater than that at the first averaging unit 340. Also, this averaging interval length may be one given from the outside or one changing dynamically. Also, the weighting factor at the second weighting unit 406 is preferably 1 or below and at the same time smaller than the weighting factor at the first weighting unit 342.

The arrangement is such that the averaging interval for the second averaging unit 404 is longer than that for the first averaging unit 340 and the weighting factor at the second weighting unit 406 is smaller than that at the first weighting unit 342. The reason is that the first baseline wander corrector 330 including the first averaging unit 340 and the second baseline wander corrector 400 including the second averaging unit 404 play different roles from each other. That is, while the first baseline wander corrector 330 is designed to respond to instantaneous wanders, the second baseline wander corrector 400 is designed to make corrections by tracking the wanders of baseline longer-term than the first baseline wander corrector 330. And to determine these longer-term baseline wanders, it is necessary for the second averaging unit 404 to carry out averaging for long intervals. "Making corrections by tracking the baseline wanders long-term" meant here is correcting wanders gradually by predicting the future trend or pattern in baseline wander from the past trend or pattern therein. However, it is to be noted that the use of the past trend of wander does not warrant correct responses to instantaneous wanders and that the past trend of wander does not necessarily foretell the future trend of wander. For this reason, it is so arranged that the weighting factor at the second weighting unit 406 is 1 or below and, in addition, of a value smaller than that at the first weighting unit 342 which tracks instantaneous wanders. In this manner, the clear division of roles between the first baseline wander corrector 330 and the second baseline wander corrector 400 assures the correction of baseline wanders by tracking not only instantaneous wanders but also long-term wanders.

Next, a description will be given of a second correction permission control unit 410. The second correction permission control unit 410 selects a signal to be outputted to the digital coarse wander corrector 408. More specifically, when the control signal for the permission or rejection of correction, which is predetermined or inputted from the outside, is a signal indicating the permission for correction, the output result of the digital coarse wander adjuster 402 is directly outputted to the digital coarse wander corrector 408. And when it is a signal rejecting the permission for correction, "0" is outputted to the digital coarse wander corrector 408. The digital coarse wander corrector 408 carries out coarse correction of baseline wander by subtracting the output signal of the second correction permission control unit 410 from the output signal of the ADC 313.

Figure 10:
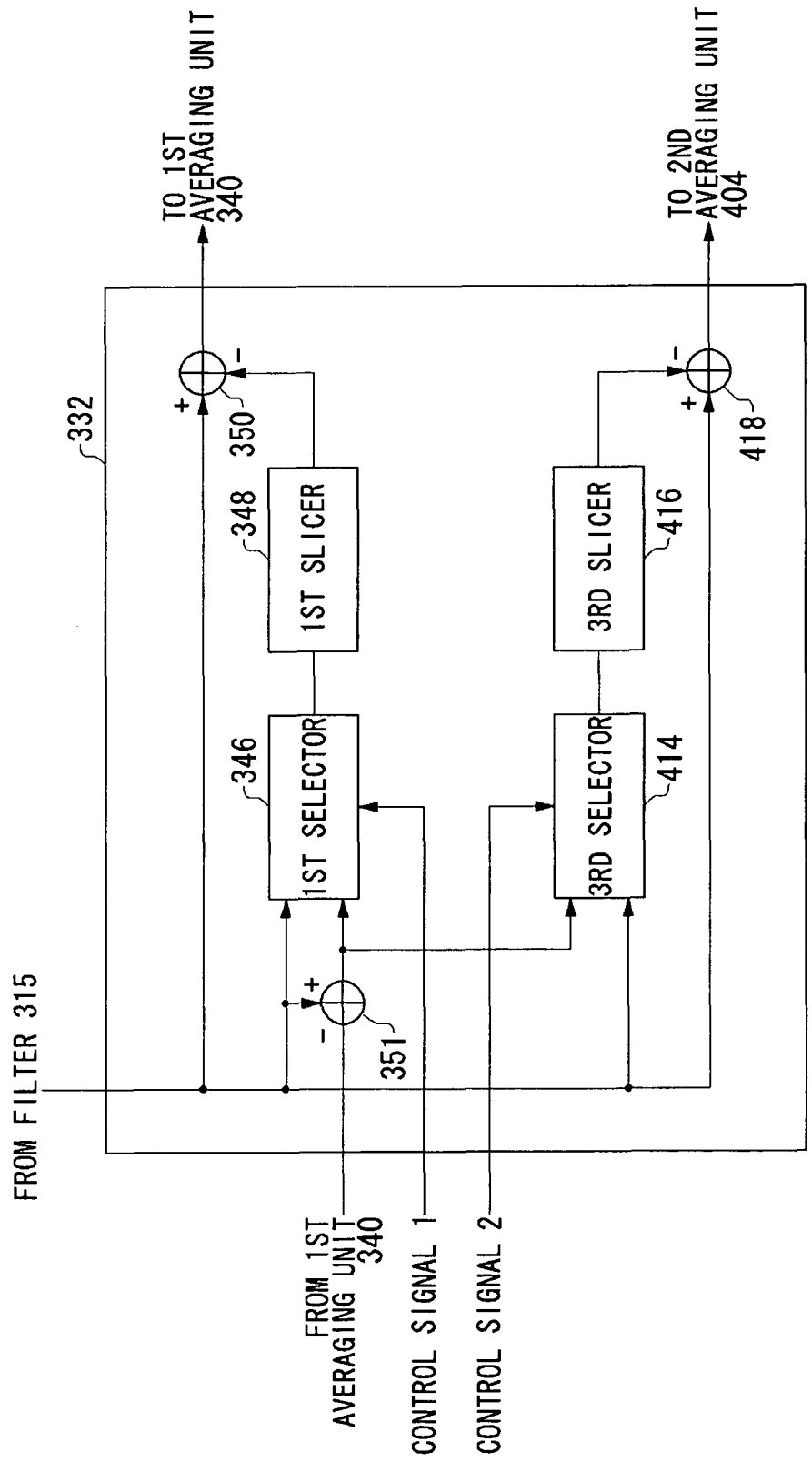
FIG. 10 illustrates a structure of a baseline wander derivation unit shown in FIG. 9.

A description will now be given of a baseline wander derivation unit 332 as shown in FIG. 9 which generates input signals for averaging by the second averaging unit 404. FIG. 10 illustrates a structure of a baseline wander derivation unit 332 as shown in FIG. 9. The baseline wander derivation unit 332 of FIG. 10 includes a first selector 346, a first slicer 348, a first fine correction amount calculator 350, a second fine correction amount calculator 351, a third selector 414, a third slicer 416, and a coarse correction amount calculator 418. Note that the same components as those of the baseline wander derivation unit 332 in FIG. 6 are denoted with the same reference numerals and the description thereof will be omitted.

Firstly, an output signal from the filter 315 and an average value, which is the output of the first averaging unit 340 as shown in FIG. 5, are inputted to the third selector 414. The third selector 414 outputs either value of the output signal from the filter 315 and the corrected value of the output signal of the filter 315 to the third slicer 416, according to the control signal inputted from the outside. The correction here is carried out by the second fine correction amount calculator 351, which subtracts the output signal of the first averaging unit 340 as shown in FIG. 5 from the output signal of the filter 315. The description of the third slicer 416 and the coarse correction amount calculator 418 is omitted because they are basically the same as the first slicer 348 and the first fine correction amount calculator 350, respectively. Also, the reason for the arrangement that either value of the output signal from the filter 315 and the corrected value of the output signal of the filter 315 can be selected is the same as one given in the description of the first selector 346, and therefore the description thereof is omitted here. The amount of coarse correction can be calculated with better accuracy by the arrangement as described above.

According to the second embodiment, even when there has been an instantaneously large wander of baseline, the baseline wander can be efficiently corrected without being affected by the delay resulting at the correction. Also, the division of roles between the two baseline wander correctors ensures the efficient and accurate correction of baseline wander without being affected by the delay resulting at the correction while tracking not only instantaneous wanders but also long-term wanders. Moreover, the amount of fine correction can be calculated with greater accuracy by correcting the amount of wander using an average value selected according to a selection signal from the outside and correcting the baseline wander using the thus corrected amount of wander.

Further, the structure implemented in the second embodiment uses a reduced scale of hardware because the second baseline wander corrector 400 does not have a circuit for independently calculating the amount of baseline wander and instead the amount of baseline wander calculated by the baseline wander derivation unit 332 of the first baseline wander corrector 330 is utilized. Also, the effect of error correction can be improved by correcting the baseline wander with better accuracy. Furthermore, the improved effect of error correction can realize a high-speed read and write control for the storage apparatus.

In the present embodiment, a description has been given with reference to FIG. 10 that a signal, which is the output signal of the filter 315 corrected by the output signal of the first averaging unit 340, is inputted as one of the inputs of the first selector 346. However, the arrangement is not limited thereto, and the output signal of the filter 315 having been corrected by the output signal of the first weighting unit 342 may be inputted as one of the inputs of the first selector 346. In this case, too, a similar advantageous effect can be achieved. Also, a description has been given that a signal, which is the output signal from the filter 315 corrected by the output signal of the first averaging unit 340, is inputted as one of the inputs of the third selector 414. However, the arrangement is not limited thereto, and a signal, which is the output signal from the filter 315 corrected by the output signal of the first weighting unit 342, may be inputted as one of the inputs of the first selector 346. In this case, too, a similar advantageous effect can be achieved.

Third Embodiment

Before explaining a third embodiment of the present invention in concrete terms, a brief description will be given of a storage apparatus relating to the present embodiment. A storage apparatus according to the present embodiment includes a hard disk controller, a magnetic disk apparatus, and a read/write channel, which includes a read channel and a write channel. At the read channel, correction of the above-mentioned baseline wander is made on the data read out from the magnetic disk apparatus by a feedforward control, and the baseline wander is also corrected at stages anterior to and posterior to an A-D converter. By employing this structure, it is possible to correct baseline wander efficiently and accurately without the effects of delay occurring at the time of correction not only when there is instantaneously a large wander of baseline but also when the baseline varies gradually over a long period of time. Furthermore, the correction is made for a long-term wander at two stages of before and after an A-D converter, more fine-tuned and detailed correction can be made. This will be described in detail later.

Figure 11:
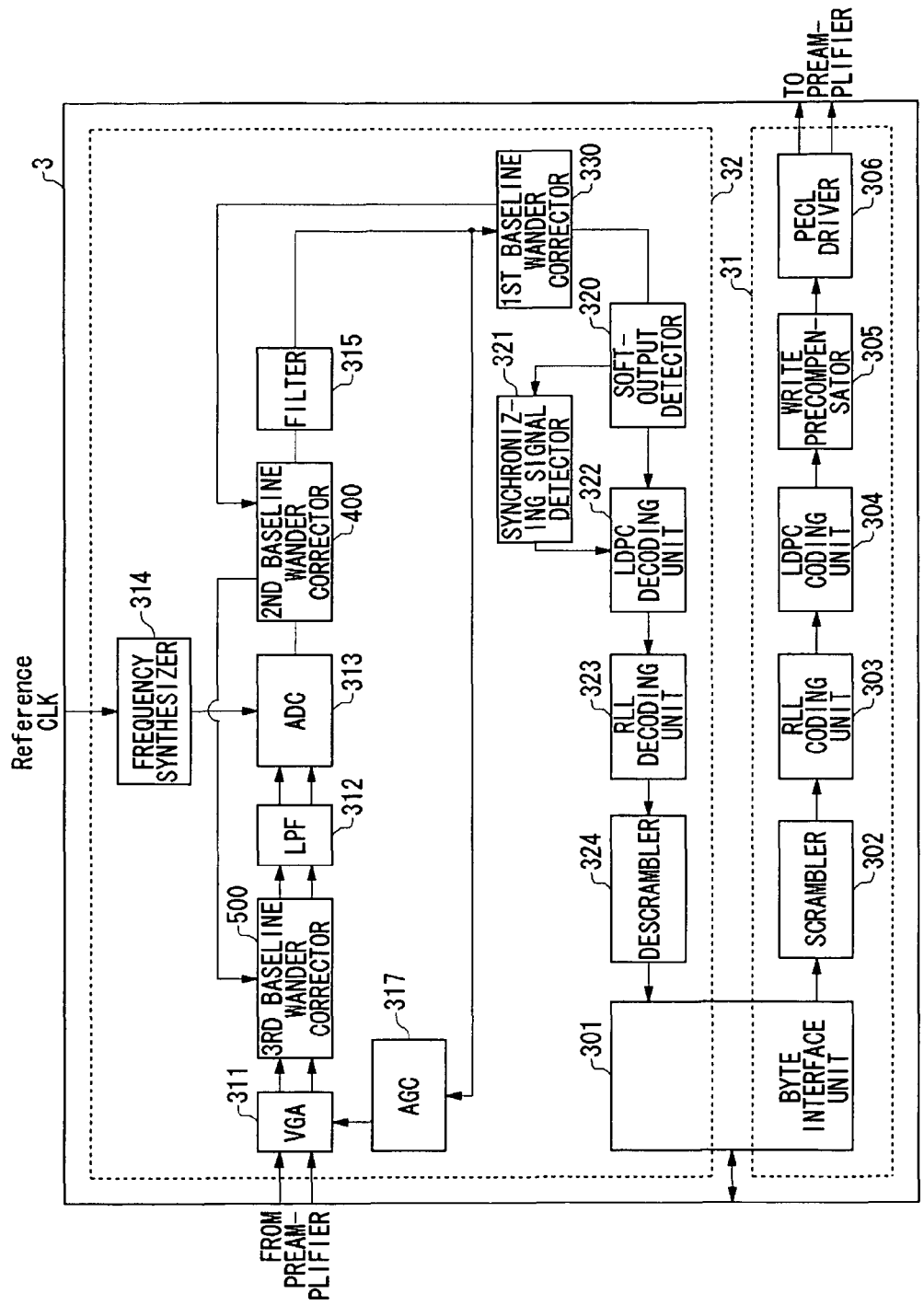
FIG. 11 illustrates a structure of an R/W channel according to a third embodiment of the present invention.

FIG. 11 illustrates a structure of an R/W channel 3 according to a third embodiment. The R/W channel 3 is comprised roughly of a write channel 31 and a read channel 32. The read channel 32 includes a VGA 311, an LPF 312, an AGC 317, an ADC 313, a frequency synthesizer 314, a filter 315, a soft-output detector 320, an LDPC decoding unit 322, a synchronizing signal detector 321, a run-length limited decoding unit 323, a descrambler 324, a first baseline wander corrector 330, and a second baseline wander corrector 400, and a third baseline wander corrector 500. Note that the components identical to those in FIG. 8 are given the same reference numerals and the description thereof will be omitted here.

Figure 12:
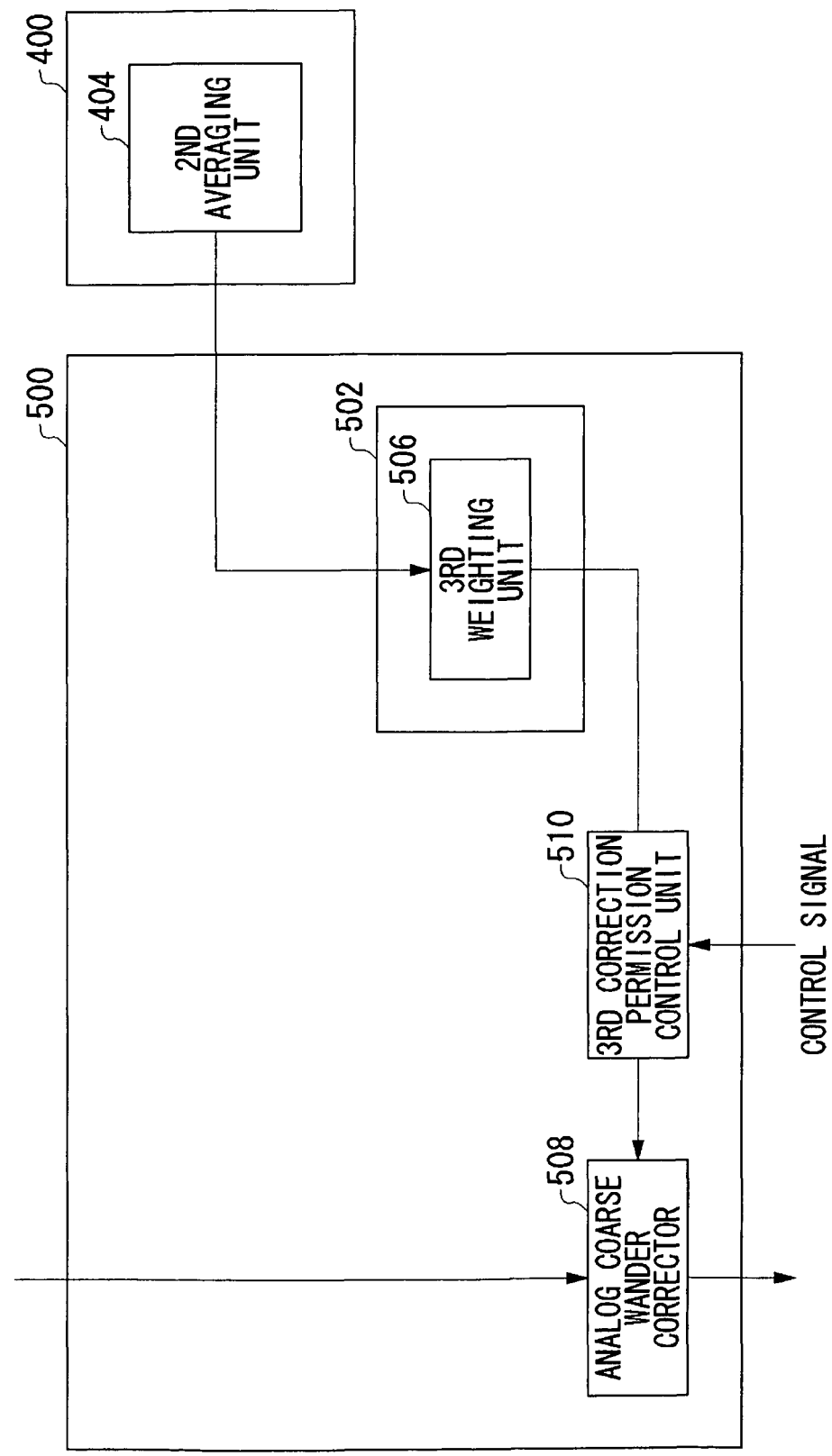
FIG. 12 illustrates a structure of a third baseline wander correcting unit shown in FIG. 11.

FIG. 12 illustrates a structure of a third baseline wander corrector 500 as shown in FIG. 11. The third baseline wander corrector 500 includes an analog coarse wander adjuster 502, an analog coarse wander corrector 508, and a third correction permission control unit 510. And the analog coarse wander adjuster 502 includes a third weighting unit 506.

The analog coarse wander adjuster 502 includes a third weighting unit 506. The third weighting unit 506 acquires the amount of analog coarse correction by multiplying the average value outputted from the second averaging unit 404 by a predetermined weighting factor, using this output signal as the input. Note that the weighting factor at the third weighting unit 506 is preferably 1 or below and less than the weighting unit 342 and the second correction permission control unit 410 both not shown in FIG. 12.

The reason why the weighting factor in the third weighting unit 506 is set to a value less than those in the first weighting unit 342 and the second weighting unit 406 is that they play different roles from each other. That is, while the first baseline wander corrector 330 including the first weighting unit 342 is designed to respond to instantaneous wanders, the third baseline wander corrector 500 is designed to make corrections by tracking the wanders of baseline longer-term than the first baseline wander corrector 330. Also, since, similar to the purpose of the third baseline wander corrector 500, the second baseline wander corrector 400 including the second weighting unit 406 is designed to make corrections by tracking the wonderings of baseline longer-term than the first baseline wander corrector 330, different weighting factors are used between them. This is due to the respective positions at which they are positioned. The third baseline wander corrector 500 placed in an earlier stage is to treat a signal of more future. However, as was discussed above, more future the signal belongs to, more difficult it is to predict the wander of the baseline from the past trend of wander. For this reason, the weighting factor of the third weighting unit 506 is set smaller than the weighting factor of the second weighting unit 406. In this manner, the clear division of roles among the first baseline wander corrector 330, the second baseline wander corrector 400 and the third baseline wander corrector 500 assures the correction of baseline wanders by tracking not only instantaneous wanders but also long-term wanders.

Next, a description will be given of a third correction permission control unit 510. The third correction permission control unit 510 selects a signal to be outputted to the analog coarse wander corrector 508. More specifically, when the control signal for the permission or rejection of correction, which is predetermined or inputted from the outside, is a signal indicating the permission for correction, the output result of the analog coarse wander adjuster 502 is directly outputted to the analog coarse wander corrector 508. And when it is a signal rejecting the permission for correction, "0" is outputted to the analog coarse wander corrector 508. The analog coarse wander corrector 508 carries out coarse correction of baseline wander by subtracting the output signal of the third correction permission control unit 510 from the output signal of the VGA 311.

According to the third embodiment, even when there has been an instantaneously large wander of baseline, the baseline wander can be efficiently corrected without being affected by the delay resulting at the correction. The baseline wanders are corrected at two stages anterior to and posterior to the A-D converter, in the long term. This structure ensures the efficient, accurate and fine-tuned correction of baseline wander without being affected by the delay resulting at the correction while tracking not only instantaneous wanders but also long-term wanders that gradually advance. Further, the structure implemented in the third embodiment uses a reduced scale of hardware because the third baseline wander corrector 500 does not have a circuit for independently calculating the amount of baseline wander and instead the amount of baseline wander calculated by the baseline wander derivation unit 332 of the first baseline wander corrector 330 is utilized. Moreover, the amount of fine correction can be calculated with greater accuracy by correcting the amount of wander using an average value selected according to a selection signal from the outside and correcting the baseline wander using the thus corrected amount of wander. Also, the effect of error correction can be improved by correcting the baseline wander with better accuracy. Furthermore, the improved effect of error correction can realize a high-speed read and write control for the storage apparatus.

In the present embodiment, a description was given in the case when the third baseline wander corrector 500 is provided between the VGA and the LPF 312. However, this should not be considered limiting and, for example, the third baseline wander corrector 500 may be provided before the VGA 311 or subsequent to the LPF 312.

The present invention has been described based on the embodiments. These embodiments are merely exemplary, and it is understood by those skilled in the art that various modifications to the combination of each component and process thereof are possible and that such modifications as well as any combination among the embodiments described above are also within the scope of the present invention.

What is claimed is:

1. A signal processing apparatus, including:
   a first baseline wander correcting unit which corrects baseline wander by a feedforward control, said first baseline wander correcting unit being provided in a processing path in which a predetermined processing is performed on an input signal; and
   a second baseline wander correcting unit, provided anterior to said first baseline wander unit, which corrects the baseline wander by a feedback control,
   said first baseline wander correcting unit including:
      a baseline wander derivation unit which derives an amount of baseline wander;
      a fine correction amount adjuster which calculates a first value corresponding to a first average value of the amount of baseline wander derived by the baseline wander derivation unit and calculates a fine-adjusted correction amount according to the first value; and
      a fine wander corrector which corrects the baseline wander by using the fine-adjusted correction amount, and
   said second baseline wander correcting unit including:
      a coarse correction amount adjuster which calculates a second value corresponding to a second average value of the amount of baseline wander derived by the baseline wander derivation unit and calculates a coarse-adjusted correction amount according to the second value; and
      a coarse corrector which corrects the baseline wander by using the coarse-adjusted correction amount.

2. The signal processing apparatus according to claim 1, wherein said first baseline correcting unit corrects the baseline wander by a feedforward control, and
   said second baseline correcting unit corrects the baseline wander by a feedback control.

3. The signal processing apparatus according to claim 1, further including:
   an analog-to-digital (A-D) converter provided anterior to said second baseline wander correcting unit; and
   a third baseline wander correcting unit, provided anterior to said A-D converter, which corrects baseline wander of an analog signal by using the second average value calculated by the coarse correction amount adjuster.

4. The signal processing apparatus according to claim 1, wherein said first baseline wander correcting unit further includes a correction permission control unit which controls permission or rejection of correction, and
   wherein the fine wander corrector corrects the baseline wander of the input signal, based on a control of the correction permission control unit.

5. The signal processing apparatus according to claim 4, wherein when it is determined by the correction permission control unit that correction of baseline wander is not required, the correction permission control unit disables the baseline correction by the fine wander corrector.

6. The signal processing apparatus according to claim 5, wherein when the amount of baseline wander is less than a threshold value, the correction permission control unit determines that the correction of baseline wander is not required.

7. The signal processing apparatus according to claim 1, wherein the fine correction amount adjuster includes a first averaging unit which calculates an average value of a signal in a first interval (so as to generate the first average value),
   wherein the coarse correction amount adjuster calculates an average value of a signal in a second interval (so as to generate the second average value), and
   wherein the second interval is longer than the first interval.

8. The signal processing apparatus according to claim 1, wherein the fine correction amount adjuster includes a first weighting unit which generates the first value by multiplying a first weighting factor by the first average value calculated in the fine correction amount adjuster,
   wherein the coarse correction amount adjuster includes a second weighting unit which generates the second value by multiplying a second weighting factor by the second average value calculated in the coarse correction amount adjuster, and
   wherein the second weighting factor is greater than the first weighting factor.

9. The signal processing apparatus according to claim 3, wherein the fine correction amount adjuster includes a first weighting unit which generates a first value by multiplying a first weighting factor by the first average value calculated in the fine correction amount adjuster,
   wherein the coarse correction amount adjuster includes a second weighting unit which generates a second value by multiplying a second weighting factor by the second average value calculated in the coarse correction amount adjuster,
   wherein the third baseline wander correcting unit includes a third weighting unit which multiplies a third weighting factor by the second average value calculated in the coarse correction amount adjuster, and
   wherein the third weighting factor is less than both the first weighting factor and the second weighting factor.

10. The signal processing apparatus according to claim 1, wherein the baseline wander derivation unit includes:
    a slicer which performs a hard decision processing on a signal subjected to the predetermined processing; and
    a subtractor which subtracts the signal which has been hard-decision processed by the slicer, from the signal subjected to the predetermined processing.

11. The signal processing apparatus according to claim 10, wherein the baseline wander derivation unit further includes a selector which receives (i) the signal subjected to the predetermined processing and (ii) a signal obtained by subtracting the first average value calculated in the fine correction amount adjuster from the signal subjected to the predetermined processing, and which outputs either to the slicer, according to a predetermined selection signal.

12. A signal processing method including first correcting baseline wander and second correcting baseline wander which is to be performed before the first correcting baseline wander, the first correcting baseline wander including:
- deriving an amount of baseline wander;
- calculating a first value corresponding to a first average value of the amount of baseline wander;
- calculating a fine-adjusted correction amount according to the first value; and
- correcting the baseline wander by using the fine-adjusted correction amount, and the second correcting baseline wander including:
- calculating a second value corresponding to second average value of the amount of baseline wander;
- calculating a coarse adjusted correction amount according to the second value; and
- correcting the baseline wander by using the coarse-adjusted correction amount.

13. A storage system having a write channel and a read channel, the write channel including:
- a first encoding unit which encodes data into a run length code;
- a second encoding unit which further encodes the data encoded by the first encoding unit, using a low-density parity check code; and
- a write unit which writes the data encoded by the second encoding unit to a storage apparatus, and the read channel including:
- a plurality of baseline wander correcting units which correct baseline wander of the data read out of the storage apparatus;
- a soft-output detector which calculates the likelihood of the data whose baseline is corrected by the plurality of baseline wander correcting units and which outputs a soft decision value;
- a second decoding unit, corresponding to the second encoding unit, which decodes the data outputted from the soft-output detector; and
- a first decoding unit, corresponding to the first encoding unit, which decodes the data decoded by the second decoding unit, wherein the plurality of baseline wander correcting units include:
- a first baseline wander correcting unit which corrects baseline wander by a feedforward control, said first baseline wander correcting unit is provided in a processing path in which a predetermined processing is performed on an input signal; and
- a second baseline wander correcting unit, provided anterior to said first baseline wander unit, which corrects the baseline wander by a feedback control, the first baseline wander correcting unit including:
- a baseline wander derivation unit which derives an amount of baseline wander;
- a fine correction amount adjuster which calculates a value corresponding to an average value of the amount of baseline wander derived by the baseline wander derivation unit and fine-adjusts a correction amount of baseline wander; and
- a fine wander corrector which corrects the baseline wander by using the fine-adjusted correction amount, and the second baseline wander correcting unit including:
- a coarse correction amount adjuster which calculates a value corresponding to an average value of the amount of baseline wander derived by the baseline wander derivation unit and coarse-adjusts a correction amount of baseline wander; and
- a coarse corrector which corrects the baseline wander by using the coarse-adjusted correction amount.

14. The storage system according to claim 13, further including:
- a storage apparatus which stores data; and
- a control unit which controls write of data to the storage apparatus and read of data from the storage apparatus,
- wherein the read channel reads out the data stored in the storage apparatus in accordance with an instruction from the control unit, and
- wherein the write channel writes the data to the storage apparatus in accordance with an instruction from the control unit.

15. The signal processing apparatus according to claim 1, wherein said apparatus is integrally integrated on a single semiconductor substrate.

* * * * *